United States Patent [19]

Levinstein et al.

[11] 4,378,628
[45] Apr. 5, 1983

[54] COBALT SILICIDE METALLIZATION FOR SEMICONDUCTOR INTEGRATED CIRCUITS

[75] Inventors: Hyman J. Levinstein, Berkeley Heights; Shyam P. Murarka; Ashok K. Sinha, both of New Providence, all of N.J.

[73] Assignee: Bell Telephone Laboratories, Incorporated, Murray Hill, N.J.

[21] Appl. No.: 296,914

[22] Filed: Aug. 27, 1981

[51] Int. Cl.³ .......................................... H01L 21/285
[52] U.S. Cl. .......................................... 29/571; 29/591; 427/88; 357/67
[58] Field of Search .................... 29/571, 591; 427/88; 357/67

[56] References Cited

U.S. PATENT DOCUMENTS

| | | | |
|---|---|---|---|
| 3,617,824 | 11/1971 | Shinoda et al. | 357/52 X |
| 4,109,372 | 8/1978 | Geffken | 29/578 X |
| 4,180,596 | 12/1979 | Crowder et al. | 29/591 X |
| 4,283,439 | 8/1981 | Higashinakagawa et al. | 427/89 |
| 4,285,761 | 8/1981 | Fatula et al. | 29/571 X |
| 4,339,869 | 7/1982 | Reihl et al. | 357/67 X |

OTHER PUBLICATIONS

G. J. van Gurp and C. Langereis, "Cobalt Silicide Layers on Si. I. Structure and Growth," Journal of Applied Physics, vol. 46, No. 10, pp. 4301–4307 (1975).

R. K. Watts et al., "Electron Beam Lithography for Small MOSFETs," IEDM Digest (Wash., D.C., 1980), pp. 772–775.

*Primary Examiner*—G. Ozaki
*Attorney, Agent, or Firm*—David I. Caplan

[57] ABSTRACT

In order to form MOSFET structures, a cobalt layer (16) is deposited and sintered, at about 400° C. to 500° C., on a patterned semiconductor wafer having exposed polycrystalline (14) or monocrystalline (11) silicon portions, as well as exposed oxide (15 or 25) portions. The cobalt reacts with exposed surfaces of the silicon portions and forms thereat such compounds as cobalt monosilicide (CoSi) or di-cobalt silicide ($CO_2Si$), or a mixture of both. The unreacted cobalt is selectively removed, as by selective etching in a suitable acid bath. A heat treatment at about 700° C. or more, preferably in an oxidizing ambient which contains typically about 2 percent oxygen, converts the cobalt compound(s) into relatively stable cobalt disilicide ($CoSi_2$). Subsequently, deposition of an in situ doped layer (33) of polycrystalline silicon (polysilicon) on the cobalt disilicide contacting the monocrystalline silicon portions—followed by gettering, deposition of a layer (34) of aluminum, and standard etch-patterning of the aluminum and polysilicon layers—completes the metallization of the desired MOSFET structures on the silicon wafer.

22 Claims, 6 Drawing Figures

COBALT SILICIDE METALLIZATION FOR SEMICONDUCTOR INTEGRATED CIRCUITS

FIELD OF THE INVENTION

This invention relates to the field of semiconductor apparatus and, more particularly, to methods of fabricating electrodes for transistors.

BACKGROUND OF THE INVENTION

In the prior art, cobalt silicide electrodes have been suggested for commercial use as electrode metallization contacts to silicon in semiconductor transistor devices, particularly insulated gate field effect transistor devices. When a cobalt silicide electrode metallization contact to silicon is initially made at a temperature below about 550° C., such an electrode is essentially formed as cobalt monosilicide (CoSi); and if, as ordinarily desired during further processing thereafter, the temperature of the device being fabricated is subsequently raised to a value above about 600° C., then the cobalt monosilicide is converted into cobalt disilicide (CoSi$_2$) and this conversion produces an increase in the volume of the cobalt silicide. Such an increase in volume can cause undesirable strains unless there is sufficient empty space (such as that provided by an exposed surface of the cobalt silicide) into which the cobalt disilicide can expand.

If a contact to silicon is initially formed directly as cobalt disilicide by heating cobalt metal in contact with the silicon to a temperature above about 550° C. or 600° C., then the subsequent need to raise the processing temperature to a value above 900° C.—for such purposes as gettering of impurities, or annealing of damage, or flowing of phosphosilicate glass (P-glass)—causes undesirable grain growth in the cobalt disilicide as well as undesirable migration of silicon from the underlying source and drain regions to the cobalt disilicide electrode, which migration deteriorates the transistor operation. Furthermore, heating of the cobalt disilicide to temperatures above about 900° C. increases the resistance of the cobalt disilicide—which is especially undesirable for the gate electrode—probably because of intermixing of the cobalt disilicide with silicon. In addition, at temperatures above about 600° C., pure cobalt itself reacts with the silicon dioxide ordinarily present on the wafer in regions removed from the cobalt silicide electrode, whereby undesirable compounds are formed that are difficult to remove differentially, i.e., while leaving intact the cobalt silicide as ordinarily desired in patterning the structure by differential etching. Also, above about 600° C., cobalt has a tendency to draw, by diffusion into itself, any nearby silicon or phosphorus, which undesirably lengthens the gate electrode and deteriorates any phosphorus doped glass (P-glass). It would, therefore, be desirable to have a method of forming cobalt disilicide electrode contacts to silicon which alleviates these problems.

SUMMARY OF THE INVENTION

Cobalt disilicide electrode metallization contacts to underlying silicon (either polycrystalline or monocrystalline) are formed, in accordance with the invention, by sintering (heat-treating) a cobalt silicide layer in contact with silicon at a temperature of about 700° C. or more in an oxidizing ambient, preferably containing at least about 1 percent oxygen by volume. Thereby cobalt disilicide electrodes form coated with silicon dioxide, the silicon of said dioxide having diffused thereto from the underlying silicon through the cobalt silicide, so that the resulting cobalt disilicide electrodes are relatively stable during further processing steps. Alternatively, the ambient in which the cobalt silicide layer is sintered at 700° C. or more need not be oxidizing, in which case the resulting cobalt disilicide is coated by a separate deposition step with a layer of silicon dioxide. By "cobalt-rich silicide" is meant compounds of cobalt silicide (such as Co$_2$Si) having a cobalt to silicon atomic ratio greater than that of cobalt monosilicide. Mixtures of compounds of cobalt monosilicide and cobalt-rich silicide, whether or not mixed with cobalt disilicide, are denoted simply by "cobalt silicide."

In a specific embodiment of the invention, an insulated gate field effect transistor device structure is fabricated in a silicon semiconductor substrate or body, with source and drain electrode metallization contacts to the silicon body, or with gate electrode metallization contacts to a polycrystalline silicon gate, or with both—such contacts being essentially cobalt disilicide. These metallization contacts are formed by first sintering cobalt on the silicon (body or gate) at a relatively low temperature (typically about 450° C.), and thereafter sintering at a relatively high temperature (above about 700° C.) in an oxidizing ambient typically containing about 1 percent oxygen.

More specifically, in accordance with the invention, a cobalt metal layer is deposited to a desired thickness on a major surface of a patterned semiconductor silicon wafer in which the transistor is being fabricated, the degree or stage of patterning of the wafer at the time of this cobalt deposition depending upon whether cobalt silicide metallization of a gate electrode or of source and drain electrodes is desired. After deposition of the metal layer of cobalt, the metal is sintered at the relatively low temperature (about 450° C.) to the underlying silicon or polysilicon (polycrystalline silicon) with which the cobalt layer is in contact, in order to form cobalt silicide. The unreacted cobalt, that is, the cobalt in contact with non-silicon portions (typically silicon dioxide or P-glass portions) is removed by selective etching which removes the cobalt but which does not remove the cobalt silicide. Thereafter—but before any further processing involving heating (which would produce undesirable strains due to volume changes accompanying the formation of cobalt disilicide)—the cobalt silicide is again sintered, this time in the oxidizing ambient (typically about 2 percent oxygen) at the relatively high temperature (typically about 700° C. to 950° C. or more) to form electrodes of cobalt disilicide.

When forming further source and drain electrode metallization, after forming the cobalt disilicide electrodes in accordance with the invention, advantageously in-situ doped polysilicon is deposited on the cobalt disilicide, in order to provide good step coverage for a further deposition of aluminum metallization on the polysilicon and, at the same time, to protect against undesirable reactions ("spiking") of the aluminum with the cobalt disilicide in the source and drain regions which can otherwise result on further heat treatments of the wafer at or above about 400° C.

Resistivities of the resulting cobalt disilicide electrodes made in accordance with the invention can be as low as 20 micro-ohm cm, with contact resistances substantially equal to or lower than that obtained by the use of aluminum directly in contact with silicon or polysilicon. Moreover, these cobalt disilicide electrodes are suitably stable against undesired migration of cobalt which would otherwise occur during further transistor processing steps at the relatively high temperatures (above about 600° C.) ordinarily required for gettering of impurities, chemical vapor deposition of phosphosilicate glass for electrical isolation, or chemical vapor deposition of silicon nitride for sealing purposes. It should be understood, however, that the relatively high temperature (700° C. to 900° C. or more) at which the cobalt disilicide is stabilized in the oxidizing ambient, in accordance with the invention, need not be as high as the highest subsequent processing temperature to be used.

It is theorized that the oxidizing property of the ambient in which the cobalt disilicide is stabilized at or above 700° C., in accordance with the invention, is useful for preventing the formation of cobalt monosilicide or cobalt-rich silicides and for providing a thin (about 50 to 70 Angstroms) coating of silicon dioxide on the cobalt disilicide layer, this coating being useful for suppressing subsequent interdiffusion of the cobalt disilicide with any nearby silicon or phosphorus. The utility of the invention, of course, is not dependent on the correctness of this theory.

BRIEF DESCRIPTION OF THE DRAWING

This invention, together with its advantages, features, and objects, can be better understood from the following detailed description when read in conjunction with the drawings in which.

Only for the sake of clarity, none of the drawings is to any scale.

DETAILED DESCRIPTION

Figure 1:
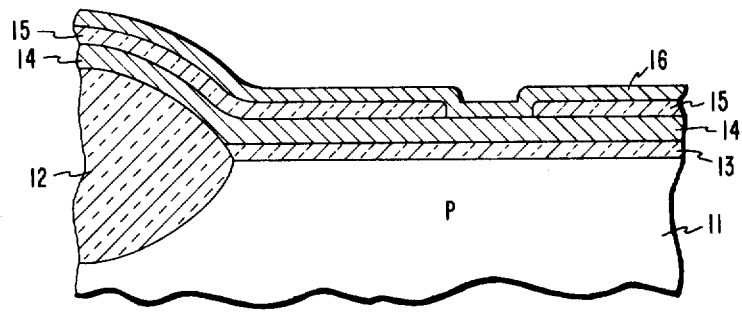
FIGS. 1-6 depict, in cross-section, various stages of manufacture of an insulated gate field effect transistor in accordance with a specific embodiment of the invention.
Figure 2:
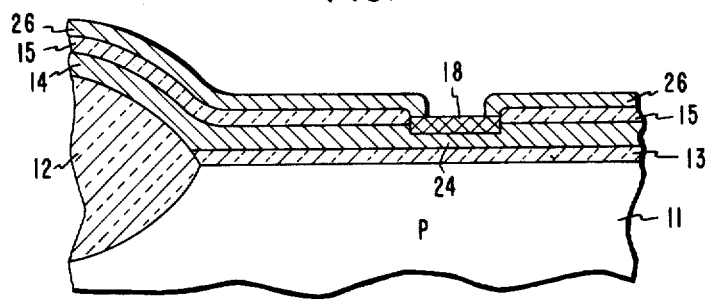
Figure 3:
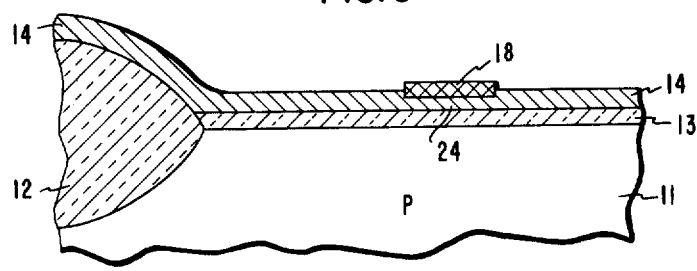
Figure 6:
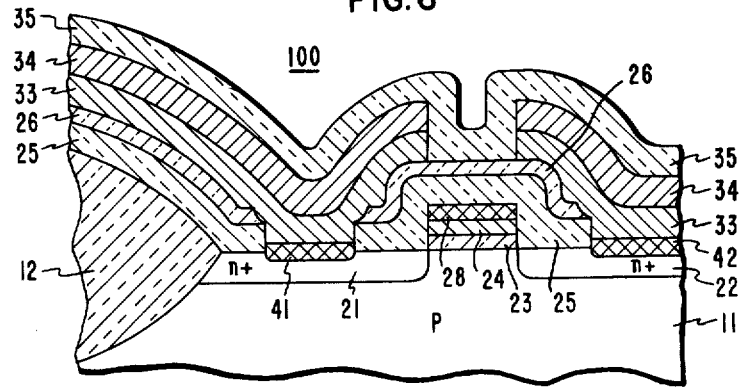

In order to fabricate an insulated gate field effect transistor device structure 100 (FIG. 6), on a major surface of a p-type silicon wafer or body 11 (FIG. 1) are successively formed a field oxide layer 12, a gate oxide layer 13, a polysilicon layer 14, a silicon dioxide masking layer 15 patterned with apertures, and a cobalt metal layer 16. The polysilicon layer 14 has a thickness ordinarily in the range of about 2000 to 5000 Angstroms, typically about 3000 Angstroms. The cobalt layer 16 has a thickness ordinarily in the range of about 300 to 700 Angstroms, typically about 600 Angstroms. This cobalt layer 16 can be deposited, for example, by known Argon ion sputtering techniques at room temperature or by evaporation while the silicon body is held at about 200° C. to 250° C.—as described for example, in G. J. VanGurp et al., 46 *Journal of Applied Physics*, pp. 4308-4311 at pp. 4308-4309 (1975). Then the structure being fabricated is heated in an inert ambient, such as forming gas (nitrogen containing about 15 percent of hydrogen by volume) at one atmosphere, so that the cobalt layer 16 is heated to a first temperature in the range of about 400° C. to 550° C., typically about 450° C., typically for about two hours. As a consequence of this first heat treatment, the cobalt layer 16 is converted into a cobalt silicide layer 18 in regions overlying in direct contact with a thinned polysilicon layer portion 24 underlying an aperture in the silicon dioxide masking layer 15, whereas the cobalt layer 16 remains as a cobalt layer 26 (FIG. 2) in regions overlying the masking layer 15—that is, in regions overlying the complement of the exposed polysilicon portions. The cobalt layer 26 is then removed, as by an etch treatment of the structure with an acid solution—typically a 5:3:1:1 volume mixture of concentrated acetic, nitric, phosphoric, and sulfuric acids (C. J. Smithells, *Metals Reference Handbook*, Vol. 1, p. 328)—which leaves intact the cobalt silicide layer 18 (FIG. 3).

Next, the exposed portion of the silicon dioxide masking layer 15 is removed, as by selective etching with buffered hydrofluoric acid (BHF) using the cobalt silicide layer 18 as a protective mask against etching. Then the exposed portions of the polysilicon layer 14 are removed, as by plasma etching or by reactive ion etching, from regions complementary to the cobalt silicide layer 18 again using this cobalt silicide layer 18 as a protective mask against etching. Next, the exposed portions of silicon dioxide layer 13 are etched with a solution, such as commercial buffered hydrofluoric acid (30:1), that does not remove the cobalt silicide layer 18. The remaining thinned polysilicon layer portion 24 and a silicon dioxide layer portion 23 underlie the cobalt silicide layer 18. This cobalt silicide layer 18 is now to be converted into cobalt disilicide.

Figure 4:
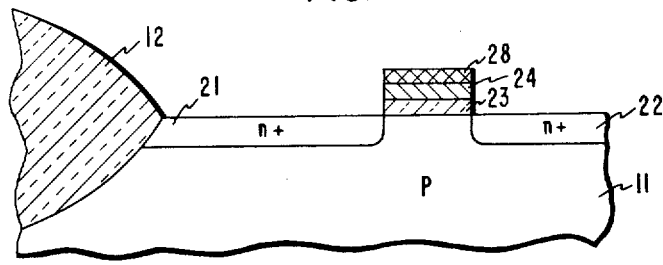

After cleaning the top surface of the structure, typically with commercial buffered hydrofluoric acid (30:1) for about 30 to 60 seconds, the structure being fabricated is then subjected, this time in an oxidizing ambient, to a second heat treatment at a second temperature of at least 700° C., ordinarily in the range of about 700° C. to 1000° C., typically about 900° C., for about one-half hour. This oxidizing ambient advantageously is an inert gas, such as argon, mixed with oxygen in a molar concentration in the range of about 1 percent to 5 percent, typically about 2 percent. As a consequence of this latter heating, the cobalt silicide layer 18 is converted into a cobalt disilicide layer 28 (FIG. 4).

It is important for most transistor device applications, particularly insulated gate field effect transistors, that the cobalt disilicide layer 28 does not penetrate down to the underlying silicon dioxide layer 23; therefore, a suitably large thickness should be selected for the polysilicon layer 14 (which combines chemically with the overlying cobalt layer 16 to form the cobalt silicide layer 18 and then the cobalt disilicide layer 28), so that some of the polysilicon layer 24 still remains underlying the cobalt disilicide layer 28. In this manner, also, the remaining polysilicon is available (by diffusion) for the formation, if desired, of silicon dioxide as an insulator on top of the cobalt disilicide.

Next, the n+ source and drain zones 21 and 22 are formed, as by conventional ion implantation and diffusion of donor impurities, using the combined cobalt disilicide layer 28 and the polysilicon layer as a protective (self-aligned) mask against introduction of impurities thereunder.

Figure 5:
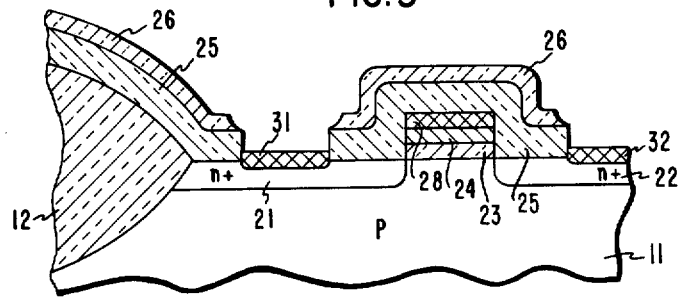

Next, a phosphosilicate glass (P-glass) layer and a chemical vapor deposited (CVD) silicon nitride layer are successively formed on the structure at elevated temperatures typically in the range of about 700° C. to 900° C., and about 700° C. to 800° C., respectively, as described in greater detail, for example, the concurrently filed application of Clemens and Sinha Ser. No. 296,832, filed Aug. 27, 1981, entitled "Stabilization of N-Channel Transistors by Chemical Vapor Deposited Silicon Nitride Layer." The CVD nitride layer is then isotropically etched, as by plasma etching, at selected locations that overlie those portions of the source and drain zones 21 and 22 where the source and drain electrode contacts to the silicon are to be formed. Thereby, a patterned CVD silicon nitride layer 26 (FIG. 5) is formed, useful for protecting the transistor to be formed from such contaminants as hydrogen. Then, the P-glass layer is selectively anisotropically etched (steep, substantially vertical sidewall), as by ion beam etching, in order to form a patterned P-glass layer 25 and to expose underlying portions of the source and drain zones 21 and 22.

Next, another cobalt layer—of thickness in the range of about 100 to 700 Angstroms, typically about 500 Angstroms—is deposited. The structure is then heated to the relatively low temperature—400° C. to 550° C., typically about 450° C. for one-half hour—so that this latter cobalt layer combines with the silicon to form cobalt silicide electrodes 31 and 32 at the exposed portions of the source and drain zones 21 and 22. The cobalt remaining at the complementary portions of the structure is removed, as by acid etching (for example, as described above in connection with the cobalt silicide layer 18), without removing the cobalt silicide. After cleaning the structure, typically with commercial buffered hydrofluoric acid (30:1), the cobalt silicide electrodes 31 and 32 are converted into cobalt disilicide electrodes 41 and 42 by heating as described above in conjunction with formation of the cobalt disilicide layer 28, i.e., by heating in an oxidizing ambient at a temperature preferable in the range of about 700° C. to 1000° C., typically about 900° C., for about half an hour. These cobalt disilicide electrodes 41 and 42 (FIG. 6) directly contact the source and drain zones 21 and 22, respectively.

Next, a polysilicon layer, preferably doped in situ (doped while being deposited) with phosphorus, is formed all over the top surface of the structure being fabricated. Then, in order to getter the impurities, the structure is heated to a temperature in the range of about 950° C. to 1000° C., typically in an ambient of phosphorus tribromide (PBr$_3$) vapor and about 2 percent oxygen in nitrogen, for about 30 minutes.

Then, a layer of aluminum is deposited—as by evaporation—on the last deposited polysilicon layer. By conventional masking and etching, the aluminum and polysilicon layers are selectively etched to form a polysilicon metallization layer 33 and an aluminum metallization layer 34 suitable for interconnection of the source and drain zones 21 and 22 of the transistor structure 100. The polysilicon layer 33 serves to provide good metallization step coverage and to furnish a desirable barrier against interdiffusion of aluminum and cobalt disilicide. Finally, a plasma deposited silicon nitride layer 35 is formed all over the top surface of the structure 100 in order to seal and protect the underlying device.

The phosphorus doped polysilicon layer 33 will be stable against undesirable intermixing with underlying cobalt disilicide so long as all further processing is done below about 950° C. In case the polysilicon metallization layer 33 is doped with boron instead of phosphorus, then undesirable instability will occur by reason of intermixing of the polysilicon with the underlying cobalt disilicide if any further processing is done above about 800° C.; therefore, all further processing in such a case of boron doping is preferably done at temperatures well below 800° C., such as about 500° C.

In a typical example by way of illustration only, approximate thicknesses of the various layers are:

Field oxide layer 12: 10,000 Angstroms
Gate oxide layer 13: 250 Angstroms
Polysilicon layer 14: 3,000 Angstroms
Masking oxide layer 15: 1,500 Angstroms
P-glass layer 25: 15,000 Angstroms
CVD nitride layer 26: 1,200 Angstroms
Polysilicon layer 33: 3,500 Angstroms
Aluminum layer 34: 10,000 Angstroms
Plasma deposited nitride layer 35: 12,000 Angstroms It should be understood that the above recitation of various steps to form the structure 100 is intended to be illustrative only, and does not exclude the use of various refinements, substitutions, and additions, such as further cleaning and annealing steps as known in the art. Also, the CVD nitride layer 26 can be omitted in cases where the "hot electron" problem (caused by undesirable interactions involving hydrogen in the gate oxide, the hydrogen originating from the plasma deposited nitride layer 35) is not serious—for example, in cases where the source-to-drain operating voltage does not exceed about 5 volts.

Although the invention has been described in detail in terms of a specific embodiment, various modifications can be made without departing from the scope of the invention. For example, the first heat treatment of the cobalt can be at about 600° C. in the absence of an oxidizing agent in the ambient, in order to form directly the cobalt disilicide in regions overlying the exposed silicon portions of the patterned wafer; however, differential etching of the cobalt metal is then more difficult, so that the direct initial formation of cobalt disilicide is better used in cases where a photoresist "lift-off" method is used, that is, in cases where the then exposed complementary portion of the patterned wafer is essentially metallic cobalt underlain by photoresist to be lifted off together with the overlying cobalt.

The second heat treatment, in the oxidizing ambient, produces a thin layer (about 50 to 100 Angstroms) of silicon dioxide on the surface of the cobalt disilicide, the silicon in this layer of silicon dioxide having diffused thereto from the underlying polysilicon layer. As an alternative to this second heat treatment in the oxidizing ambient, a silicon dioxide layer can be deposited on the cobalt silicide layer, as by chemical vapor deposition, either before or after (preferably after, especially in case of gate electrode formation) a heat treatment at 700° C. or more to convert the cobalt silicide into cobalt disilicide.

The technique of forming the relatively stable cobalt disilicide electrodes in accordance with the invention may be used to form such electrodes in other electronic device contexts; and the cobalt disilicide electrodes of the invention can be used solely for the gate electrode in conjunction with other electrodes for source and drain contacts, or vice versa, and also in conjunction with other techniques for electrical isolation of gate, source, and drain, as well as in conjunction with other techniques then silicon nitride (CVD or plasma deposited) for sealing the device structure. Finally, various annealing steps can be added, typically at temperatures in the range of about 450° C. to 950° C., for example, between the above processing steps of cobalt disilicide formation and aluminum metallization.

What is claimed is:

1. A method for fabricating cobalt disilicide electrode metallization contacts for a semiconductor integrated circuit including heating a cobalt silicide layer overlying in contact with exposed silicon portions of a patterned silicon wafer to a temperature of at least 700° C., whereby said layer is converted into a layer essentially of cobalt disilicide, and forming a layer of silicon dioxide on said layer of cobalt disilicide.

2. The method of claim 1 in which the temperature is in the range of about 700° C. to 1000° C.

3. The method of claim 1 or 2 in which said ambient is an oxidizing ambient whereby said layer of silicon dioxide during said heating forms on said layer of cobalt disilicide.

4. The method of claim 3 in which the ambient contains oxygen in a molar concentration in the range of about 0.5 to 5.0 percent.

5. The method recited in claim 1 or 2 followed by the steps of:
  (a) depositing a polysilicon layer on said cobalt disilicide layer; and
  (b) depositing an aluminum layer on said polysilicon layer.

6. In a method for fabricating a silicon device:
  (a) depositing a metal layer of cobalt on a patterned silicon wafer having exposed silicon portions;
  (b) heating the cobalt to a first temperature in the range of about 400° C. to 550° C., in order to form a cobalt silicide layer overlying in contact with said silicon portions, whereby cobalt metal remains overlying the complement of said silicon portions;
  (c) removing the cobalt metal overlying those portions of the silicon wafer complementary to said exposed silicon portions thereof, whereby the cobalt silicide layer remains intact; and
  (d) heating the cobalt silicide layer to a second temperature of at least about 700° C. in an oxidizing ambient in order to convert the cobalt silicide layer into a cobalt disilicide layer contacting said silicon portions.

7. The steps of claim 6 followed by the step of: depositing a doped in situ polysilicon layer on said cobalt disilicide layer.

8. The step of claim 7 followed by the step of: depositing an aluminum layer on said polysilicon layer.

9. The steps of claim 8 in which said ambient contains oxygen in a molar concentration in the range of about 0.5 to 5.0 percent.

10. The steps of claim 9 in which said ambient contains oxygen in a molar concentration of about 2 percent.

11. The steps of claim 6 or 7 in which said ambient contains oxygen in a molar concentration in the range of about 0.5 to 5.0 percent.

12. The steps of claim 11 in which said ambient contains oxygen in a molar concentration of about 2 percent.

13. The steps of claim 6, 7, 8, 9 or 10 in which said first temperature is in the range of about 400° C. to 550° C.

14. The steps of claim 11 in which said first temperature is about 450° C.

15. In a method for fabricating an insulated gate field effect transistor, the steps for fabricating gate electrode metallization comprising:
  (a) depositing a layer of cobalt on a patterned silicon wafer having exposed portions of a polysilicon layer;
  (b) heating the wafer to a first temperature in the range of about 400° C. to 550° C., for a time sufficient to convert first portions of said layer of cobalt which overlies the exposed portions of the polysilicon layer into a layer of cobalt silicide, whereby second portions of said layer of cobalt complementary to said first portions remain as cobalt;
  (c) removing, by selective etching, said second portions of said layer of cobalt complementary to said first portions;
  (d) heating the wafer to a second temperature of at least about 700° C. in an oxidizing ambient for a time sufficient to convert said layer of cobalt silicide into a layer of cobalt disilicide.

16. The steps of claim 15 in which said second temperature is in the range of about 700° C. to 1000° C.

17. The steps of claim 15 in which said first temperature is about 450° C.

18. The steps for claim 15, 16, or 17 in which the thickness of the polysilicon layer is so great that some polysilicon thereof remains underlying the layer of cobalt disilicide.

19. The steps of claim 18 in which said ambient contains oxygen in a molar concentration in the range of about 0.5 to 5.0 percent.

20. The steps of claim 18 in which said ambient contains oxygen in a molar concentration of about 2 percent.

21. The steps of claim 15, 16, or 17 in which said ambient contains oxygen in a molar concentration in the range of about 0.5 to 5.0 percent.

22. The steps of claim 15, 16, or 17 in which said ambient contains oxygen in a molar concentration of about 2 percent.

* * * * *